US008629041B2

(12) United States Patent
Tane et al.

(10) Patent No.: US 8,629,041 B2
(45) Date of Patent: Jan. 14, 2014

(54) METHOD FOR MANUFACTURING SEMICONDUCTOR DEVICE

(75) Inventors: Yasuo Tane, Mie-ken (JP); Yukio Katamura, Mie-ken (JP); Atsushi Yoshimura, Kanagawa-ken (JP); Fumihiro Iwami, Kanagawa-ken (JP); Kazuyoshi Sakurai, Saitama-ken (JP)

(73) Assignees: Kabushiki Kaisha Toshiba, Tokyo (JP); KYOCERA Chemical Corporation, Kawaguchi-shi (JP)

( * ) Notice: Subject to any disclaimer, the term of this patent is extended or adjusted under 35 U.S.C. 154(b) by 83 days.

(21) Appl. No.: 13/091,682

(22) Filed: Apr. 21, 2011

(65) Prior Publication Data

US 2011/0263078 A1    Oct. 27, 2011

(30) Foreign Application Priority Data

Apr. 23, 2010  (JP) ................................. 2010-100321

(51) Int. Cl.
*H01L 21/00*    (2006.01)

(52) U.S. Cl.
USPC ......................................................... 438/454

(58) Field of Classification Search
USPC .......................................... 738/118; 438/118
See application file for complete search history.

(56) References Cited

U.S. PATENT DOCUMENTS

| 2006/0012020 A1* | 1/2006 | Gilleo ........................... 257/678 |
| 2007/0191552 A1* | 8/2007 | Ichiroku et al. ............... 525/476 |
| 2009/0246915 A1* | 10/2009 | Ichikawa et al. ............. 438/118 |
| 2011/0151195 A1* | 6/2011 | Mitsukura et al. ............ 428/156 |
| 2011/0263097 A1* | 10/2011 | Yoshimura et al. ........... 438/463 |

FOREIGN PATENT DOCUMENTS

| JP | 2008-288571 | 11/2008 |
| JP | 2009-34582 | 2/2009 |

OTHER PUBLICATIONS

U.S. Appl. No. 13/226,152, filed Sep. 6, 2011, Tane, et al.

* cited by examiner

*Primary Examiner* — Charles Garber
*Assistant Examiner* — Andre' C Stevenson
(74) *Attorney, Agent, or Firm* — Oblon, Spivak, McClelland, Maier & Neustadt, L.L.P.

(57) ABSTRACT

According to one embodiment, a method is disclosed for manufacturing a semiconductor device. The method can include die bonding to bond a semiconductor element to a first position of a base member via a bonding layer provided on one surface of the semiconductor element. The method can include wire bonding to connect a terminal formed on the semiconductor element to a terminal formed on the base member by a bonding wire. In addition, the method can include sealing to seal the semiconductor element and the bonding wire. Viscosity of the bonding layer in the bonding is controlled not to exceed the viscosity of the bonding layer in the sealing.

19 Claims, 3 Drawing Sheets

METHOD FOR MANUFACTURING SEMICONDUCTOR DEVICE

CROSS-REFERENCE TO RELATED APPLICATIONS

This application is based upon and claims the benefit of priority from the prior Japanese Patent Application No. 2010-100321, filed on Apr. 23, 2010; the entire contents of which are incorporated herein by reference.

FIELD

Embodiments described herein relate generally to a method for manufacturing a semiconductor device.

BACKGROUND

Conventionally, there has been proposed a bonding material suitable to be discharged using a noncontact applicator onto the rear surface (the surface opposed to the surface on which a circuit pattern is formed) of a semiconductor element (see JP-A 2009-34582(kokai)).

However, the productivity may decrease unless the viscosity of the bonding layer formed from the bonding material is adjusted by considering various assembly processes, such as the sealing process, of the semiconductor device.

DETAILED DESCRIPTION

Figure 1:
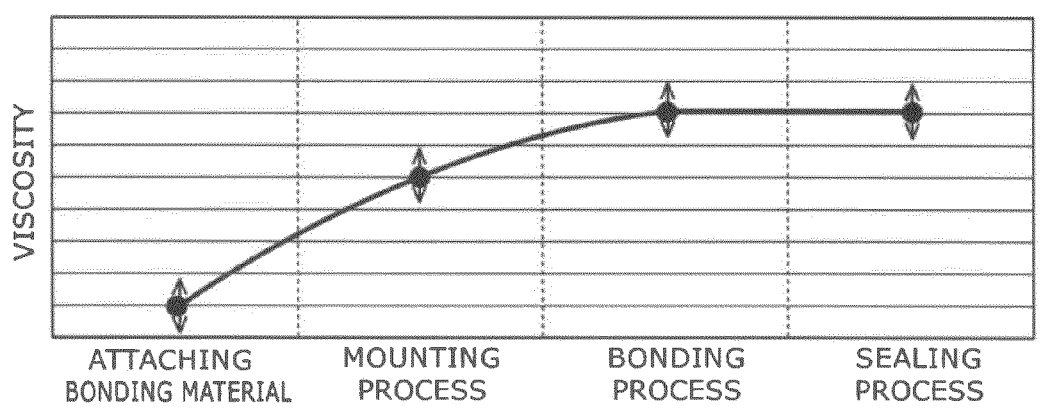
FIG. 1 is a schematic diagram for illustrating a method for manufacturing a semiconductor device according to an embodiment.

In general, according to one embodiment, a method is disclosed for manufacturing a semiconductor device. The method can include die bonding to bond a semiconductor element to a first position of a base member via a bonding layer provided on one surface of the semiconductor element. The method can include wire bonding to connect a terminal formed on the semiconductor element to a terminal formed on the base member by a bonding wire. In addition, the method can include sealing to seal the semiconductor element and the bonding wire. Viscosity of the bonding layer in the bonding is controlled not to exceed the viscosity of the bonding layer in the sealing.

Various embodiments will now be illustrated hereinafter with reference to the accompanying drawings.

Here, in the process for manufacturing a semiconductor device, the so-called upstream process includes the process of forming a circuit pattern on a wafer surface by film formation, resist formation, exposure, development, etching, and resist removal, the inspection process, the cleaning process, the heat treatment process, the impurity doping process, the diffusion process, and the planarization process. Furthermore, the so-called downstream process includes the assembly process including the dicing process, die bonding process, wire bonding process, and sealing process, and the inspection process for inspecting functionality and reliability.

In a method for manufacturing a semiconductor device according to this embodiment, the assembly process is configured to control the viscosity of a bonding layer (the degree of curing of the bonding layer) provided on one surface of a semiconductor element (semiconductor chip), or the viscosity of the bonding layer (the degree of curing of the bonding layer) between the semiconductor element and the base member. That is, as described later, the viscosity of the bonding layer in at least one process selected from the group consisting of the die bonding process, the wire bonding process, and the sealing process is controlled so as to fall within a prescribed range. Furthermore, the viscosity of the bonding material forming the bonding layer is controlled. Here, except for controlling the viscosity of the bonding layer (the degree of curing of the bonding layer) and the viscosity of the bonding material, known techniques are applicable, and hence the detailed description of each of the aforementioned processes is omitted.

In particular, forming a bonding layer on the rear surface of a semiconductor element using a noncontact applicator and forming a bonding layer on the rear surface of a semiconductor element using a die attach film (hereinafter also referred to as "DAF") are different in controlling of the viscosity of the bonding layer. More specifically, forming a bonding layer on the rear surface of a semiconductor element using a noncontact applicator corresponds to forming a DAF on the rear surface of the semiconductor element. This is different from laminating a completed DAF on the rear surface of the semiconductor element.

FIG. 1 is a schematic diagram for illustrating a method for manufacturing a semiconductor device using a noncontact applicator according to this embodiment.

Here, FIG. 1 conceptually shows the viscosity of a bonding material forming a bonding layer, the viscosity of the bonding layer in the die bonding process, the viscosity of the bonding layer in the bonding process, and the viscosity of the bonding layer in the sealing process, which are described later. Arrows in the figure conceptually represent the viscosity range in the respective processes.

First, the viscosity of the bonding material attached to the rear surface of a wafer or semiconductor element is illustrated. As an example, the bonding material can include a resin as a solute, and a solvent.

The resin can be e.g. an insulating resin. The insulating resin can be e.g. a thermosetting resin or a thermoplastic resin. Here, in view of bondability and heat resistance, the resin is preferably a thermosetting resin such as epoxy resin, acrylic resin, urethane resin, and silicone resin, and more preferably epoxy resin. The epoxy resin can be e.g. bisphenol A epoxy resin, bisphenol F epoxy resin, or novolac epoxy resin. These resins may be used singly, or used as a mixture of two or more thereof.

The solvent can be suitably selected from those capable of dissolving the solute resin. For instance, the solvent can be γ-butyrolactone (GBL), cyclohexanone, or isophorone. These solvents may be used singly, or used as a mixture of two or more thereof. Furthermore, a known curing accelerator, catalyst, filler, or coupling agent can be added thereto as necessary.

Here, if there are irregularities on the surface of the bonding layer formed, then when the semiconductor element is bonded to a base member, air may be taken in and generate a void. The generation of such a void may cause trouble such as the decrease of bonding strength. Thus, an additive operative to suppress the surface tension difference (leveling action)

can also be added to suppress the generation of irregularities on the surface of the bonding layer. The additive operative to suppress the surface tension difference can be e.g. a silicone surface conditioner, an acrylic surface conditioner, or a vinyl surface conditioner. Here, it is preferable to use the silicone surface conditioner having a significant effect of equalizing the surface tension.

Methods for attaching the bonding material in a film form can include e.g. coating, ink jet method, spray method, mist coating, roll coater method, screen printing method, jet dispensing, and squeegeeing. Here, it is preferable to use the ink jet method or the spray method by which the bonding material can be attached in a film form without contact with the semiconductor element. It is more preferable to use the ink jet method by which a thin film with a uniform thickness can be formed.

Here, in the case where the ink jet method is used as the method for attaching the bonding material in a film form, the viscosity of the bonding material at 25° C. is preferably set to 0.015 Pa·s or less in order to suppress clogging of the discharge nozzle. This viscosity is measured by a B-type viscometer (JIS K 7117-2).

In this case, the viscosity of the bonding material can be controlled by the amount of the solute resin and the amount of the solvent.

For instance, the solute can be epoxy resin, and the solvent can be γ-butyrolactone (GBL). If the proportion of epoxy resin in the bonding material is set to approximately 25% by weight, then the viscosity of the bonding material at 25° C. can be set to 0.015 Pa·s or less.

The thickness (film thickness) of the bonding material attached in a film form is not limited. However, in view of evaporation of the solvent described later, the film thickness of the bonding material is preferably set to approximately 1 μm (micrometer) for a single application. Furthermore, if the thickness of the bonding material attached in a film form is set to approximately 10 μm (micrometer), generation of irregularities on the surface of the bonding layer can also be suppressed.

The bonding material thus attached in a film form is converted to the B-stage to form a bonding layer. When the bonding material is converted to the B-stage, the bonding material attached in a film form is heated to evaporate the solvent.

To heat the bonding material attached in a film form, heating means such as a heater can be used. For instance, the wafer can be mounted on a mounting section including a heater, and the bonding material can be heated via the wafer.

In this case, the heating temperature (the temperature of the mounting section) can be set to e.g. 40° C. or more and 120° C. or less.

The composition of the bonding material and the thickness (film thickness) of the bonding material attached in a film form are suitably adjusted to determine a proper heating temperature.

For instance, the solute of the bonding material can be epoxy resin, and the solvent can be y-butyrolactone (GBL). The proportion of epoxy resin in the bonding material can be set to 25% by weight, and the thickness of the bonding material attached in a film form can be set to approximately 10 μm (micrometers). Then, the heating temperature (the temperature of the mounting section) can be set to approximately 70° C.

Thus, a bonding layer can be formed on the rear surface of the wafer.

To thicken the thickness of the bonding layer, the aforementioned procedure can be repeated to form a bonding layer as stacked layers.

Thus, by dicing the wafer with the bonding layer formed on the rear surface, a semiconductor element with the bonding layer formed on the rear surface can be obtained. The semiconductor element with the bonding layer formed on the rear surface is bonded to a base member via the bonding layer in the die bonding process described later.

In the foregoing example, the wafer with the bonding layer formed on the rear surface is diced to obtain a semiconductor element with the bonding layer formed on the rear surface. However, this embodiment is not limited thereto.

For instance, a semiconductor element with the bonding layer formed on the rear surface can be obtained also by performing the so-called pre-dicing and forming a bonding layer on the rear surface of the diced wafer.

Next, the viscosity of the bonding layer (the degree of curing of the bonding layer) in the die bonding process is illustrated.

In the die bonding process, the semiconductor element with the bonding layer formed on the rear surface is knocked up one by one with a needle from the adhesive sheet. The semiconductor element knocked up is picked up by vacuum suction with a bonding collet. Then, the semiconductor element picked up with the bonding collet is pressure and bonded via the bonding layer to a prescribed position of the base member heated. That is, in the die bonding process, the semiconductor element is bonded to a prescribed position of the base member via the bonding layer provided on one surface of the semiconductor element.

Figure 2A:
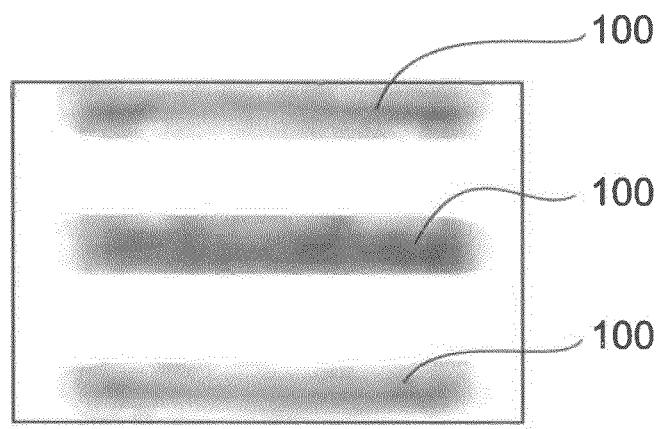
FIG. 2A is a schematic view for illustrating the state of bonding, in the case where the viscosity of the bonding layer is too high
Figure 2B:
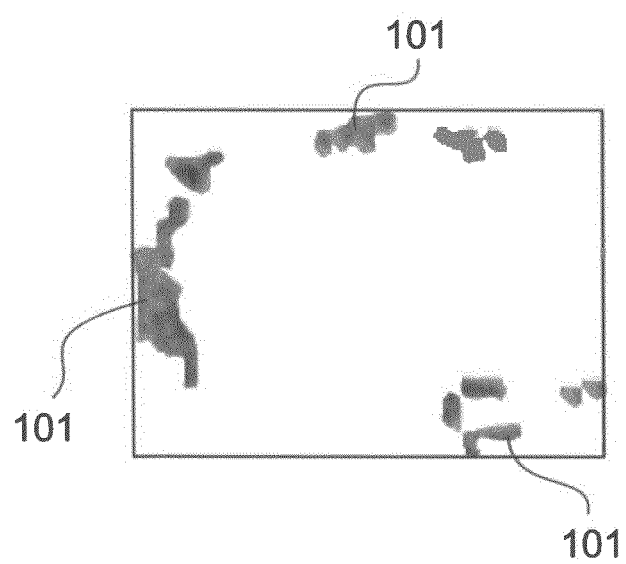
FIG. 2B is a schematic view for illustrating the state of bonding, in the case where the viscosity of the bonding layer is too low.

FIGS. 2A and 2B are schematic views for illustrating the influence of the viscosity of the bonding layer on bonding. Here, FIG. 2A is a schematic view for illustrating the state of bonding in the case where the viscosity of the bonding layer is too high. FIG. 2B is a schematic view for illustrating the state of bonding in the case where the viscosity of the bonding layer is too low.

If the viscosity of the bonding layer is too high in the die bonding process, a striped bonding unevenness 100 may occur in the bonding portion as shown in FIG. 2A. The occurrence of such bonding unevenness 100 may decrease the bonding strength.

On the other hand, if the viscosity of the bonding layer is too low, microvoids 101 may occur in the bonding portion as shown in FIG. 2B. The occurrence of such microvoids 101 may decrease the bonding strength. This also causes misalignment in bonding the semiconductor element to the base member.

These phenomena are specific to forming a bonding layer on the rear surface of a semiconductor element using a non-contact applicator. In contrast, these phenomena do not occur in laminating a DAF, which is a completed bonding layer, on the rear surface of a semiconductor element.

The inventors have found that the occurrence of striped bonding unevenness can be suppressed by setting the viscosity of the bonding layer at the die bonding temperature to 3000 Pa·s or less. Furthermore, the occurrence of microvoids and misalignment can be suppressed by setting the viscosity of the bonding layer at the die bonding temperature to 10 Pa·s or more. That is, in the die bonding process, the viscosity of the bonding layer at the die bonding temperature during bonding is controlled so as to be 10 Pa·s or more and 3000 Pa·s or less. These viscosities are measured by a dynamic viscoelasticity measurement device (parallel plate oscillatory rheometer).

Thus, as shown in FIG. 1, the viscosity of the bonding layer formed by converting the bonding material attached in a film form to the B-stage is increased to a proper viscosity range in the die bonding process. In this case, the viscosity of the bonding layer can be increased by heat treatment. Furthermore, in this heat treatment, the viscosity of the bonding layer can be controlled by the heating temperature and heating time. Here, viscosity measurement can be based on the known viscosity measurement method as specified in the Japanese Industrial Standard JIS K 7244-10, for instance. In this case, the viscosity can be measured by the dynamic viscoelasticity measurement device (parallel plate oscillatory rheometer).

The heat treatment of the bonding layer can be performed by the aforementioned mounting section including a heater. That is, when the bonding material attached in a film form is converted to the B-stage to form a bonding layer, the viscosity can be adjusted to a proper viscosity in the die bonding process.

Furthermore, heat treatment can be performed using a heating furnace during the period between the aforementioned formation of the bonding layer and the die bonding process. The heating furnace can be e.g. a curing furnace for precuring. Examples of such a curing furnace include a furnace with heating means such as heaters installed above and below a belt conveyor, and a furnace using hot air for heating.

Furthermore, the viscosity can be controlled by heating the bonding layer in the die bonding process. However, even in the case of controlling the viscosity of the bonding layer in the die bonding process, the viscosity of the bonding layer is preferably adjusted in the previous stage to such a value as to facilitate controlling the viscosity in the die bonding process.

In this case, for instance, the solute of the bonding material can be epoxy resin, and the solvent can be γ-butyrolactone (GBL). The proportion of epoxy resin in the bonding material can be 25% by weight, the thickness of the bonding layer can be approximately 10 μm (micrometers), and the viscosity of the bonding layer at 25° C. before heat treatment can be approximately 0.015 Pa·s. Then, the heating temperature can be set to approximately 90° C., and the heating time can be set to approximately 1 hour. Thus, a bonding layer having a viscosity of approximately 100 Pa·s at 150° C. can be obtained.

Here, the viscosity of 0.015 Pa·s was measured by the B-type viscometer (JIS K 7117-2). The viscosity of 100 Pa·s at 150° C. was measured by the dynamic viscoelasticity measurement device (parallel plate oscillatory rheometer).

Next, the viscosity of the bonding layer (the degree of curing of the bonding layer) in the bonding process is illustrated.

In the bonding process, wire bonding is performed. In wire bonding, the terminal formed on the semiconductor element is connected by a bonding wire to the terminal formed on the base member such as a substrate and lead frame.

The wire bonding device for performing such wire bonding includes a bonding head. This bonding head includes an ultrasonic horn with a bonding tool provided at the tip. This ultrasonic horn is swingably driven by a driver in conjunction with a swing arm. A bonding wire made of e.g. gold (Au) is passed through the bonding tool. A ball is formed at the tip of this bonding wire. Under application of ultrasonic vibration, this ball is pressed against the terminal formed on the semiconductor element or the terminal formed on the base member such as a substrate and lead frame. Thus, bonding is performed.

Hence, if the viscosity of the bonding layer is too low in the bonding process, the ultrasonic vibration is attenuated. This may cause such as bonding failure and insufficient bonding strength of the bonding wire.

In this case, if the viscosity of the bonding layer is increased, the bonding failure and insufficient bonding strength of the bonding wire can be suppressed. However, if the viscosity of the bonding layer is excessively increased, it is difficult to control viscosity of the bonding layer in the sealing process described later. This may cause voids in the bonding layer. Thus, the viscosity control of the bonding layer in the bonding process is performed so that the viscosity does not exceed at least the upper limit of the proper range of viscosity of the bonding layer in the sealing process.

This is because it is impossible to decrease the viscosity of the bonding layer once the viscosity of the bonding layer is increased by volatilizing the solvent of the bonding layer.

Here, in the case where the viscosity of the bonding layer in the sealing process is controlled to be equal to or less than the upper limit of the proper range, it is preferable not to exceed that value. That is, preferably, the viscosity of the bonding layer in the bonding process is controlled so as not to exceed the viscosity of the bonding layer in the sealing process.

The inventors have found that the occurrence of bonding failure and insufficient bonding strength of the bonding wire can be suppressed by setting the viscosity of the bonding layer at the bonding temperature to 15000 Pa·s or more. Furthermore, viscosity control of the bonding layer in the sealing process is facilitated by setting the viscosity equal to or less than the upper limit of the viscosity of the bonding layer in the sealing process described later. Hence, in the bonding process, the viscosity of the bonding layer at the bonding temperature is controlled so as to be 15000 Pa·s or more and $10^7$ Pa·s or less. In this case, preferably, the viscosity of the bonding layer in the bonding process is controlled so as not to exceed the viscosity of the bonding layer in the sealing process. These viscosities are measured by the dynamic viscoelasticity measurement device (parallel plate oscillatory rheometer).

Such viscosity control, particularly in that the viscosity of the bonding layer depends on the subsequent process, is specific to forming a bonding layer on the rear surface of a semiconductor element using a noncontact applicator. In the example, the upper limit of the viscosity of the bonding layer in the bonding process depends on the upper limit in the subsequent sealing process.

Thus, as shown in FIG. 1, the proper viscosity in the die bonding process is further increased to obtain a proper viscosity in the bonding process. In this case, the viscosity of the bonding layer can be increased by heat treatment. Furthermore, in this heat treatment, the viscosity of the bonding layer can be controlled by the heating temperature and heating time. Here, viscosity measurement can be based on the known viscosity measurement method as specified in the Japanese Industrial Standard JIS K 7244-10, for instance. In this case, the viscosity can be measured by the dynamic viscoelasticity measurement device (parallel plate oscillatory rheometer).

The heat treatment of the bonding layer can be performed using a heating furnace during the period between the aforementioned die bonding process and the bonding process. The heating furnace can be e.g. a curing furnace for precuring. Examples of such a curing furnace include a furnace with heating means such as heaters installed above and below a belt conveyor, and a furnace using hot air for heating.

Furthermore, the viscosity can be controlled by heating the bonding layer in the bonding process.

In this case, for instance, the solute of the bonding material can be epoxy resin, and the solvent can be γ-butyrolactone (GBL). The proportion of epoxy resin in the bonding material can be 25% by weight, the thickness of the bonding layer can be approximately 10 μm (micrometers), and the viscosity of the bonding layer at 25° C. before heat treatment can be approximately 0.015 Pa·s. Then, the heating temperature can be set to approximately 90° C., and the heating time can be set to approximately 1 hour. Thus, a bonding layer having a viscosity of approximately 100 Pa·s at a bonding temperature of 150° C. can be obtained. This viscosity is measured by the dynamic viscoelasticity measurement device (parallel plate oscillatory rheometer).

Next, the viscosity of the bonding layer (the degree of curing of the bonding layer) in the sealing process is illustrated.

In the sealing process, the semiconductor element and the bonding wires connecting the terminals are sealed with resin.

The resin molding device for performing such resin molding includes a fixed mold and a movable mold, which can be opened. The resin molding device further includes a heating means for heating the fixed mold and the movable mold. Furthermore, a cavity can be formed by clamping the fixed mold and the movable mold.

In sealing using such a resin molding device, the substrate or lead frame with a semiconductor element bonded thereto is set in the cavity. A melted resin is injected into the cavity. When the melted resin is thus injected, the semiconductor element and the bonding wires connecting the terminals are sealed in a resin sealing mold (mold package) with a shape corresponding to the shape of the cavity.

Figure 3:
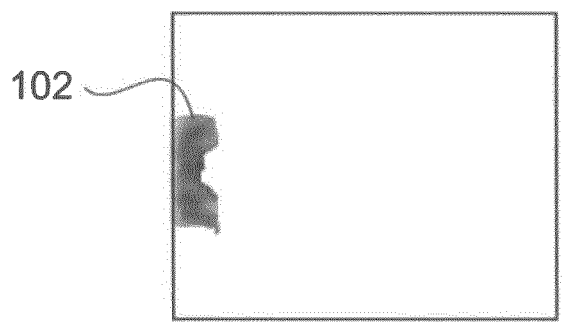
FIG. 3 is a schematic view for illustrating the influence of the viscosity of the bonding layer on sealing.

FIG. 3 is a schematic view for illustrating the influence of the viscosity of the bonding layer on sealing.

A protrusion (e.g., the portion in which a foreign body left in the bonding layer produces a gap between the semiconductor element and the base member) may be formed in the middle of the bonding layer. In the case where such a protrusion is formed, if the viscosity of the bonding layer (the degree of curing of the bonding layer) is too high, it is difficult to fill up the inside of the protrusion with the melted resin. Thus, a void 102 may occur as shown in FIG. 3.

Here, because the mold resin is buried by injection pressure during sealing, the void 102 is eliminated or reduced. However, because the pressure is relaxed upon completion of the injection of mold resin, there may be cases with insufficient burying. This may cause delamination if the attachment strength of the bonding layer is weak. Thus, the burying performance is improved by decreasing the viscosity of the mold resin. The inventors have found that the burying performance can be further improved by properly selecting the viscosity of the bonding layer.

The inventors have found that voids can be effectively buried by setting the viscosity of the bonding layer at the temperature of the sealing process to $10^7$ Pa·s or less. Thus, in the sealing process, the viscosity of the bonding layer at the temperature of the sealing process (molding temperature) is controlled so as to be $10^7$ Pa·s or less. This viscosity is measured by the dynamic viscoelasticity measurement device (parallel plate oscillatory rheometer).

On the other hand, the lower limit of the viscosity of the bonding layer in the sealing process depends on the lower limit of the viscosity of the bonding layer in the preceding process. In this example, the lower limit of the viscosity of the bonding layer in the sealing process is equal to or more than 15000 Pa·s, which is the lower limit in the bonding process.

Thus, as shown in FIG. 1, the viscosity of the bonding layer in the sealing process is controlled so as not to become too high. In this case, the viscosity of the bonding layer may be increased by heat treatment. Furthermore, in this heat treatment, the viscosity of the bonding layer can be controlled by the heating temperature and heating time. Here, viscosity measurement can be based on the known viscosity measurement method as specified in the Japanese Industrial Standard JIS K 7244-10, for instance. In this case, the viscosity can be measured by the dynamic viscoelasticity measurement device (parallel plate oscillatory rheometer).

The heat treatment of the bonding layer can be performed using a heating furnace during the period between the aforementioned bonding process and the sealing process. The heating furnace can be e.g. a curing furnace for precuring. Examples of such a curing furnace include a furnace with heating means such as heaters installed above and below a belt conveyor, and a furnace using hot air for heating.

Furthermore, the viscosity can be controlled by heating the bonding layer in the sealing process.

In this case, for instance, the solute of the bonding material can be epoxy resin, and the solvent can be γ-butyrolactone (GBL). The proportion of epoxy resin in the bonding material can be 25% by weight, the thickness of the bonding layer can be approximately 10 μm (micrometers), and the viscosity of the bonding layer at 25° C. before heat treatment can be approximately 0.015 Pa·s. Then, the heating temperature can be set to approximately 90° C., and the heating time can be set to approximately 1 hour. Thus, a bonding layer having a viscosity of approximately 100 Pa·s at 25° C. can be obtained. This viscosity is measured by the dynamic viscoelasticity measurement device (parallel plate oscillatory rheometer).

(Composition a Ratio of the Bonding Material)

The bonding material according to the embodiment can be prepared with the following composition ratio. For instance, 100 mass parts of jER1001 (manufactured by Japan Epoxy Resin Co., Ltd.) as an epoxy resin, 10 mass parts of phenol resin BRG-556 (manufactured by Showa Highpolymer Co., Ltd.) as an epoxy curing agent, 2 mass parts of KBM403 (manufactured by Shin-Etsu Chemical Co., Ltd.) as a silane coupling agent, 0.2 mass parts of 2E4MZ (manufactured by Shikoku Chemicals Corp.) and 1.5 mass parts of U-CAT SA 102 (manufactured by San-Apro Ltd.) as curing accelerators, 0.2 mass parts of BYK-302 (manufactured by BYK-Chemie Japan Co., Ltd.) as a surfactant, and 400 mass parts of γ-butyrolactone (GBL, manufactured by Mitsubishi Chemical Corp.) as an organic solvent are mixed. The mixture is heated and dissolved at 60° C. to prepare a bonding material composition (composition A).

TABLE 1 illustrates the effect of controlling the viscosity of the bonding layer in each assembly process using the bonding material of composition A.

TABLE 1

| "Die bonding process" | | | | | | | | | |
|---|---|---|---|---|---|---|---|---|---|
| B-stage temperature | 80° C. | | | 90° C. | | | 100° C. | | |
| B-stage time | 1 hour | | | 1 hour | | | 1 hour | | |
| Die bonding temperature | 100° C. | 125° C. | 150° C. | 100° C. | 125° C. | 150° C. | 100° C. | 125° C. | 150° C. |

TABLE 1-continued

| | | | | | | | | | |
|---|---|---|---|---|---|---|---|---|---|
| Melting viscosity (Pa·s) | 150 | 50 | 5 | 2300 | 1120 | 550 | 3500 | 2510 | 1800 |
| Chip misalignment *1) | None | None | Found | None | None | None | None | None | None |
| Voids *2) | None | None | Found | None | None | None | Found | None | None |
| "Bonding process" | | | | | | | | | |
| Viscosity of bonding layer at 150° C. (Pa·s) | | 19000 | | | 21000 | | | 22500 | |
| Bonding failure | | None | | | None | | | None | |
| "Sealing process" | | | | | | | | | |
| Viscosity of bonding layer at 175° C. (Pa·s) | | 20500 | | | 23500 | | | 25500 | |
| Delamination due to foreign material *3) | | None | | | None | | | None | |

The bonding material according to the embodiment can be prepared also with the following composition ratio. For instance, 60 mass parts of jER1001 (manufactured by Japan Epoxy Resin Co., Ltd.) and 40 mass parts of EOCN103S (manufactured by Nippon Kayaku Co., Ltd.) as epoxy resins, 15 mass parts of phenol resin BRG-556 (manufactured by Showa Highpolymer Co., Ltd.) as an epoxy curing agent, 2 mass parts of KBM403 (manufactured by Shin-Etsu Chemical Co., Ltd.) as a silane coupling agent, 1.0 mass part of 2E4MZ (manufactured by Shikoku Chemicals Corp.) and 0.5 mass parts of U-CAT SA 102 (manufactured by San-Apro Ltd.) as curing accelerators, 0.2 mass parts of BYK-302 (manufactured by BYK-Chemie Japan Co., Ltd.) as a surfactant, and 400 mass parts of γ-butyrolactone (GBL, manufactured by Mitsubishi Chemical Corp.) as an organic solvent are mixed. The mixture is heated and dissolved at 60° C. to prepare a bonding material composition (composition B).

TABLE 2 illustrates the effect of controlling the viscosity of the bonding layer in each assembly process using the bonding material of composition B.

TABLE 2

| "Die bonding process" | | | | | | | | | |
|---|---|---|---|---|---|---|---|---|---|
| B-stage temperature | 80° C. | | | 90° C. | | | 100° C. | | |
| B-stage time | 1 hour | | | 1 hour | | | 1 hour | | |
| Die bonding temperature | 100° C. | 125° C. | 150° C. | 100° C. | 125° C. | 150° C. | 100° C. | 125° C. | 150° C. |
| Melting viscosity (Pa·s) | 200 | 80 | 30 | 2600 | 1200 | 780 | 4300 | 3210 | 2100 |
| Chip misalignment *1) | None | None | None | None | None | None | None | None | None |
| Voids *2) | None | None | None | None | None | None | Found | Found | None |
| "Bonding process" | | | | | | | | | |
| Viscosity of bonding layer at 150° C. (Pa·s) | | 3300000 | | | 3400000 | | | 3450000 | |
| Bonding failure | | None | | | None | | | None | |
| "Sealing process" | | | | | | | | | |
| Viscosity of bonding layer at 175° C. (Pa·s) | | 3500000 | | | 3550000 | | | 3650000 | |
| Delamination due to foreign material *3) | | None | | | None | | | None | |

As a comparative example, the following composition ratio is illustrated. For instance, 100 mass parts of jER1001 (manufactured by Japan Epoxy Resin Co., Ltd.) as an epoxy resin, 15 mass parts of aromatic amine ELASMER-1000 (manufactured by Ihara Chemical Industry Co., Ltd.) as an epoxy curing agent, 2 mass parts of KBM403 (manufactured by Shin-Etsu Chemical Co., Ltd.) as a silane coupling agent, 1.0 mass part of 2E4MZ (manufactured by Shikoku Chemicals Corp.) as a curing accelerator, 0.2 mass parts of BYK-302 (manufactured by BYK-Chemie Japan Co., Ltd.) as a surfactant, and 400 mass parts of γ-butyrolactone (GBL, manufactured by Mitsubishi Chemical Corp.) as an organic solvent are mixed. The mixture is heated and dissolved at 60° C. to prepare a bonding material composition (composition C).

TABLE 3 illustrates the effect of controlling the viscosity of the bonding layer in each assembly process using the bonding material of composition C.

TABLE 3

| "Die bonding process" | | | | | | | | | |
|---|---|---|---|---|---|---|---|---|---|
| B-stage temperature | | 80° C. | | | 90° C. | | | 100° C. | |
| B-stage time | | 1 hour | | | 1 hour | | | 1 hour | |
| Die bonding temperature | 100° C. | 125° C. | 150° C. | 100° C. | 125° C. | 150° C. | 100° C. | 125° C. | 150° C. |
| Melting viscosity (Pa·s) | 100 | 30 | 5 | 900 | 450 | 180 | 1300 | 910 | 300 |
| Chip misalignment *1) | None | None | Found | None | None | None | None | None | None |
| Voids *2) | None | None | Found | None | None | None | None | None | None |
| "Bonding process" | | | | | | | | | |
| Viscosity of bonding layer at 150° C. (Pa·s) | | 5000 | | | 5500 | | | 6000 | |
| Bonding failure | | Found | | | Found | | | Found | |

Here, the details of "*1) Chip misalignment" and "*2) Voids" in the above TABLES 1 to 3, and "*3) Delamination due to foreign material" in TABLES 1 and 2 are as follows.

*1) Chip misalignment: "None" represents the case where the misalignment of the semiconductor element in the X and Y direction (in the horizontal plane) is 100 μm (micrometers) or less.

*2) Voids: The bonding state is imaged by a scanning acoustic tomograph (manufactured by Hitachi Engineering & Services Co., Ltd.). "None" represents the case where voids (gaps) occupy 5% or less of the total area.

3) Delamination due to foreign material: The bonding state is imaged by the scanning acoustic tomograph (manufactured by Hitachi Engineering & Services Co., Ltd.). "None" represents the case where voids (gaps) occupy 5% or less of the total area.

In the case illustrated in TABLE 3, bonding failure occurred in the bonding process. Hence, the sealing process was not evaluated.

The embodiment described above can realize a method for manufacturing a semiconductor device capable of improving the productivity in the assembly processes.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Moreover, above-mentioned embodiments can be combined mutually and can be carried out.

What is claimed is:

1. A method for manufacturing a semiconductor device, comprising: die bonding to bond a semiconductor element to a first position of a base member via a bonding layer provided on one surface of the semiconductor element; wire bonding to connect a terminal formed on the semiconductor element to a terminal formed on the base member by a bonding wire; and sealing to seal the semiconductor element and the bonding wire, viscosity of the bonding layer in the bonding being controlled not to exceed the viscosity of the bonding layer in the sealing, and a bonding material forming the bonding layer is controlled to be 0.015 Pa·s or less at 25° C.

2. The method according to claim 1, wherein the viscosity of the bonding layer in the sealing at a temperature of the sealing is controlled to be $10^7$ Pa·s or less.

3. The method according to claim 1, wherein the viscosity of the bonding layer in the sealing at a temperature of the sealing is controlled to be 15000 Pa·s or more.

4. The method according to claim 3, wherein the viscosity of the bonding layer in the sealing at the temperature of the sealing is controlled by heating the bonding layer.

5. The method according to claim 1, wherein the viscosity of the bonding layer in the die bonding at a die bonding temperature is controlled to be 10 Pa·s or more.

6. The method according to claim 1, wherein the viscosity of the bonding layer in the die bonding at a die bonding temperature is controlled to be 3000 Pa·s or less.

7. The method according to claim 5, wherein the viscosity of the bonding layer in the die bonding at the die bonding temperature is controlled by heating the bonding layer.

8. The method according to claim 1, wherein the viscosity of the bonding layer in the bonding at a bonding temperature is controlled to be 15000 Pa·s or more.

9. The method according to claim 1, wherein the viscosity of the bonding layer in the bonding at a bonding temperature is controlled to be $10^7$ Pa·s or less.

10. The method according to claim 8, wherein the viscosity of the bonding layer in the bonding at the bonding temperature is controlled by heating the bonding layer.

11. The method according to claim 1, wherein the viscosity at 25° C. of the bonding material forming the bonding layer is controlled by at least one of amount of solute of the bonding material and amount of solvent of the bonding material.

12. The method according to claim 1, further comprising:
forming bonding material to the surface of the semiconductor element by noncontact applicator; and
forming the bonding layer by converting the attached bonding material to B-stage.

13. The method according to claim 12, wherein the attaching of the bonding material is performed a plurality of times.

14. The method according to claim 13, wherein thickness of a film formed by attaching the bonding material a plurality of times is set to approximately 10 μm.

15. The method according to claim 12, wherein the attached bonding material is converted to the B-stage by heat treatment.

16. The method according to claim 15, wherein temperature in the heat treatment of the attached bonding material is 40° C. or more and 120° C. or less.

17. The method according to claim 1, wherein the bonding material includes an additive operative to suppress surface tension difference.

18. The method according to claim 12, wherein the bonding layer is formed on a surface opposed to a surface with a circuit pattern formed thereon.

19. The method according to claim 12, wherein the bonding material is formed to the surface of the semiconductor element by an ink jet method.

* * * * *